(12) United States Patent
Ramadass

(10) Patent No.: US 10,009,022 B2
(45) Date of Patent: Jun. 26, 2018

(54) GATE ENERGY RECOVERY

(71) Applicant: TEXAS INSTRUMENTS INCORPORATED, Dallas, TX (US)

(72) Inventor: Yogesh Kumar Ramadass, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

(21) Appl. No.: 15/653,562

(22) Filed: Jul. 19, 2017

(65) Prior Publication Data

US 2017/0317674 A1 Nov. 2, 2017

Related U.S. Application Data

(63) Continuation of application No. 14/970,694, filed on Dec. 16, 2015, now Pat. No. 9,748,950.

(51) Int. Cl.
*H03K 17/687* (2006.01)
(52) U.S. Cl.
CPC ................... *H03K 17/687* (2013.01)

(58) Field of Classification Search
None
See application file for complete search history.

(56) References Cited

U.S. PATENT DOCUMENTS

| 8,242,812 B2 | 8/2012 | Koyanagi et al. |
| 8,988,131 B2 | 3/2015 | Sadate et al. |
| 2009/0135991 A1 | 5/2009 | Chen et al. |
| 2015/0002503 A1 | 1/2015 | Park et al. |
| 2017/0179947 A1* | 6/2017 | Ramadass ............ H03K 17/687 |

* cited by examiner

*Primary Examiner* — Cassandra Cox
(74) *Attorney, Agent, or Firm* — Ebby Abraham; Charles A. Brill; Frank D. Cimino

(57) ABSTRACT

Embodiment of the inventive subject matter include an apparatus comprising a first switch, a second switch, a third switch, and a transistor. The first switch is coupled to a first voltage device and the transistor to selectively electrically connect the first voltage device to the transistor to provide a first charge to the transistor. The second switch is coupled to a second voltage device and the transistor to selectively electrically connect the second voltage device to the transistor to remove charge from the transistor. The third switch is coupled to the third voltage device and the transistor to selectively couple the third voltage device to the transistor to provide a second charge to the transistor.

10 Claims, 3 Drawing Sheets

GATE ENERGY RECOVERY

CROSS REFERENCE TO RELATED APPLICATION(S)

This continuation application claims priority to U.S. patent application Ser. No. 14/970,694, filed Dec. 16, 2015, which application is hereby incorporated by reference.

TECHNICAL FIELD

This invention relates generally to circuitry and more specifically to supplying and draining charge from a transistor.

BACKGROUND

Transistors are commonly used in circuitry as switches and to amplify an electrical signal, among other uses. Many transistors, such as field effect transistors and bipolar junction transistors, have three terminals: a gate, a source, and a drain. The source and drain terminals can be coupled to a first potential, supplied, for example by a voltage device such as a battery. The gate terminal can be connected to a second potential, supplied, for example, by a second voltage device. Supplying the second potential to the gate of the transistor applies charge to the gate. Once the applied charge increases above a threshold, the gate opens to allow current to flow through the source and drain terminals as provided by the first potential. When current is flowing through the source and drain terminals, the transistor can be referred to as "on." When the second potential is no longer applied to the gate terminal and the charge is removed from the gate, current ceases to flow through the source and drain terminals. When current is not flowing through the source and drain terminals, the transistor can be referred to as "off."

Typically, when switching a transistor from being on to off, the charge that was applied to the gate is actively drained from the gate. For example, an electrical ground can be electrically connected to the gate which pulls charge that was applied to the gate from the gate. This charge is then lost, becoming effectively lost energy. In applications where transistors are rapidly switched between on and off states, the energy lost through draining the charge can become significant.

SUMMARY

Generally speaking, and pursuant to these various embodiments, a circuit and method are provided that sequentially apply and/or remove charge to a transistor as part of respectively turning the gate on and off. When charge applied to a switch's gate is removed from the gate, at least part of that charge can be removed to a storage device and used again instead of being drained to a ground. For example, a capacitor can be used to provide a potential through which charge is applied to a transistor's gate. When draining that charge, the charge can be at least partially drained back to that capacitor before connecting the gate to an electric ground, which removes sufficient charge to fully turn off the transistor. So configured, the charge drained to the capacitor instead of to the ground can be reused the next time that the transistor is switched back on. These and other benefits can be understood with reference to the drawings and following description.

BRIEF DESCRIPTION OF THE DRAWINGS

Embodiments of the invention are illustrated in the figures of the accompanying drawings in which.

DETAILED DESCRIPTION

Introduction

This section provides an introduction to some embodiments of the inventive subject matter. Embodiments of the inventive subject matter efficiently drive a transistor through a process of applying charge to, and or draining charge from, a transistor in stages. Additionally, in some embodiments, charge is reclaimed from the gate of the driven transistor during this process. Through such a process, the reclaimed charge can be used in subsequent drive cycles to at least partially drive the gate of the transistor. One such example of a circuit is depicted in FIG. 1.

Figure 1:
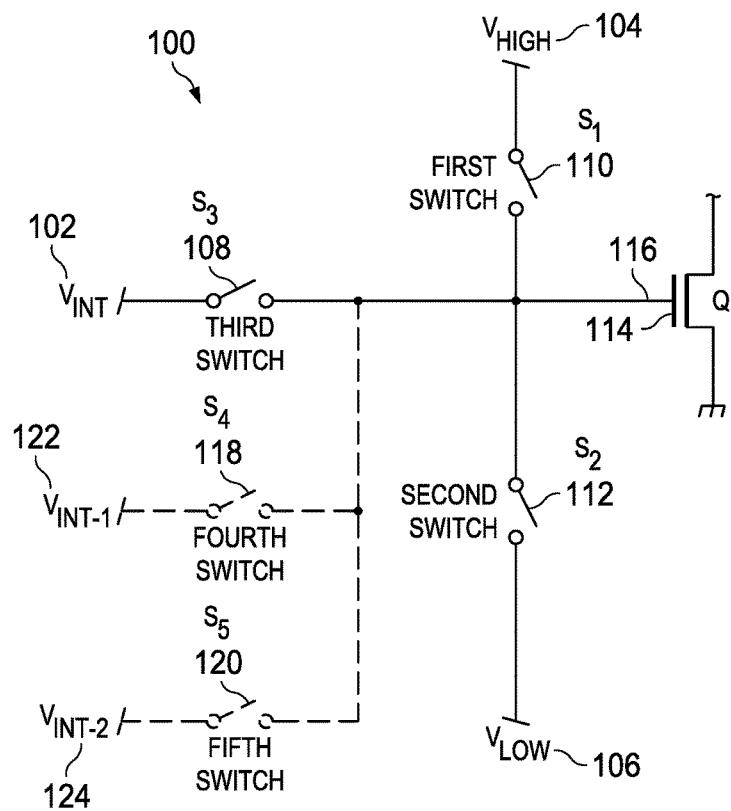
FIG. 1 depicts an example circuit 100 in which potential is applied to, and or drained from, a gate 116 of a transistor 114 in stages where charge is reclaimed from the gate 116 of the transistor 114, according to some embodiments of the inventive subject matter.

FIG. 1 depicts an example circuit 100 in which potential is applied to, and/or drained from, a gate 116 of a transistor 114 in stages where charge is reclaimed from the gate 116 of the transistor 114, according to some embodiments of the inventive subject matter. The circuit 100 of FIG. 1 includes a first switch 110, a second switch 112, a third switch 108, and a transistor 114. The circuit 100 also includes a first voltage device 104, a second voltage device 106, and a third voltage device 102. The first switch 110 is coupled to the first voltage device 104 (having a potential difference of "$V_{high}$") and a gate 116 of the transistor 114. The second switch 112 is coupled to the second voltage device 106 (having a potential difference of "$V_{low}$") and the gate 116 of the transistor 114. The third switch 108 is coupled to the third voltage device 102 (having a potential difference of "$V_{int}$") and the gate 116 of the transistor 114.

Each of the voltage devices (i.e., the first voltage device 104, the second voltage device 106, and the third voltage device 102) is operable to provide a potential difference (i.e., supply and/or drain charge) to the gate 116 of the transistor 114. For example, the voltage devices can be AC voltage sources, DC voltage sources (e.g., batteries, capacitors, etc.), grounds, or any other device able to provide a potential difference. Consequently, each of the voltage devices can be used to drive the transistor 114 via the gate 116 to allow current to flow through the source and drain of the transistor 114. Although each of the voltage devices can be used to drive the transistor 114, in some embodiments, only the first voltage device 104 (i.e., $V_{high}$) is able to provide a potential to the gate 116 of the transistor 114 that is sufficient to allow current to flow through the source and the drain of the transistor 114. In some embodiments, the second voltage device 106 (i.e., $V_{low}$) and the third voltage device 102 (i.e., $V_{int}$) are not able to provide a potential to the gate 116 of the transistor 114 that is sufficient to allow current to flow through the source and the drain of the transistor 114. Furthermore, in the example provided, the potential difference of the third voltage device 102 (i.e., $V_{int}$) is greater than that of the second voltage device 106 (i.e., $V_{low}$).

Because the third voltage device 102 may not able to provide a potential sufficient to allow current to flow through the source and drain of the transistor 114, the third switch 108 can be closed (while the first switch 110 and the second switch 112 are open) to apply a potential difference of $V_{int}$ to the gate 116 of the transistor 114 to partially drive the transistor. That is, the potential difference of $V_{int}$ can be applied to the gate 116 of the transistor 114 without turning the transistor 114 on. In other embodiments, the third voltage device 102 may be able to provide a potential sufficient to allow current to flow through the source and drain of the transistor 114. In either case, the third switch 108 can be considered a pre-charge switch because although closing the pre-charge switch applies some charge from the third voltage device 102 to a transistor 114, the charge is less than the final charge applied to the transistor 114. Next, the third switch 108 can be opened and the first switch 110 closed. Closing the first switch 110 applies a potential difference of $V_{high}$ to the gate 116 of the transistor 114. Regardless of whether the third voltage device 102 is able to provide a potential sufficient to allow current to flow through the source and drain of the transistor 114, the potential difference $V_{high}$ is sufficient to allow current to flow through the source and drain of the transistor 114. Because the potential difference of $V_{high}$ is sufficient to allow current to flow through the source and drain of the transistor 114, when the potential difference of $V_{high}$ is applied to the gate 116 of the transistor 114, the transistor 114 is turned on. Thus, in this sense, the first switch 110 can be considered an "on switch" because closing the on switch applies a charge from the first voltage device 104 to a transistor 114 that is sufficient to allow current to flow through the transistor 114.

Dependent upon the componentry of the circuit, when the first switch 110 is opened, the flow of current through the source and drain of the transistor 114 may stop. That is, in some embodiments, opening the first switch 110 may cause the transistor 114 to turn off, while in other embodiments the transistor 114 may not turn off until charge is actively drained from the gate 116 of the transistor 114. Regardless of whether current is flowing through the source and drain of the transistor 114 after the first switch 110 is opened, there still exists a potential difference across the gate 116 of the transistor 114 (i.e., charge accumulated on the gate 116 of the transistor 114). In some embodiments, the third voltage device 102 is operable to drain this potential difference from the gate 116 of the transistor 114. In such embodiments, the third switch 108 is closed while the first switch 104 and the second switch 106 remain open. If the potential of the third voltage device 102 is less than the potential difference that exists across the gate 116 of the transistor 114, the third voltage device 102 will drain charge from the gate 116 of the transistor 114. After draining charge from the gate 116 of the transistor 114 to the third voltage device 102, any remaining charge can be drained to the second voltage device 106. Any remaining charge can be drained to the second voltage device 106 by opening the third switch 108 and then closing the second switch 112. In this sense, the second switch 112 can be considered an off switch because closing the off switch allows any charge remaining on the transistor 114 to dissipate, fully closing off movement of current through the transistor 114.

Although the above text describes the pre-charge as being applied by only one voltage device (i.e., the third voltage device 102), certain embodiments are not so limited. In some embodiments, multiple voltage devices can be used to apply the pre-charge. For example, as depicted in FIG. 1 with dashed lines, two additional voltage devices (i.e., a fourth voltage device 122 and a fifth voltage device 124) can be used. In such embodiments, a fifth switch 120 can be closed first, applying a potential difference of $V_{int-2}$ to the gate 116 of the transistor 114. Once the potential across the gate 116 of the transistor 114 has stabilized, the fifth switch 120 is opened and the fourth switch 118 is closed. Closing the fourth switch 118 applies a potential difference of $V_{int-1}$ to the gate 116 of the transistor 114. Once the potential difference across the gate 116 of the transistor 114 has stabilized, the fourth switch 118 can be opened and the third switch 108 closed. As can be seen, any number of voltage devices can be used as pre-charge voltage devices. For ease of reading, portions of this specification will refer to only a single pre-charge switch and pre-charge voltage device. However, it should be noted that embodiments of the inventive subject matter can utilize a greater number of pre-charge switches and pre-charge voltage devices.

Although the discussion of FIG. 1 describes driving a transistor via a gate of the transistor, in some embodiments, the transistor can be driven by terminals other than the gate. For example, in some embodiments, the transistor can be driven by a back gate (or any other terminal) in lieu of, or in addition to, the gate.

Figure 2:
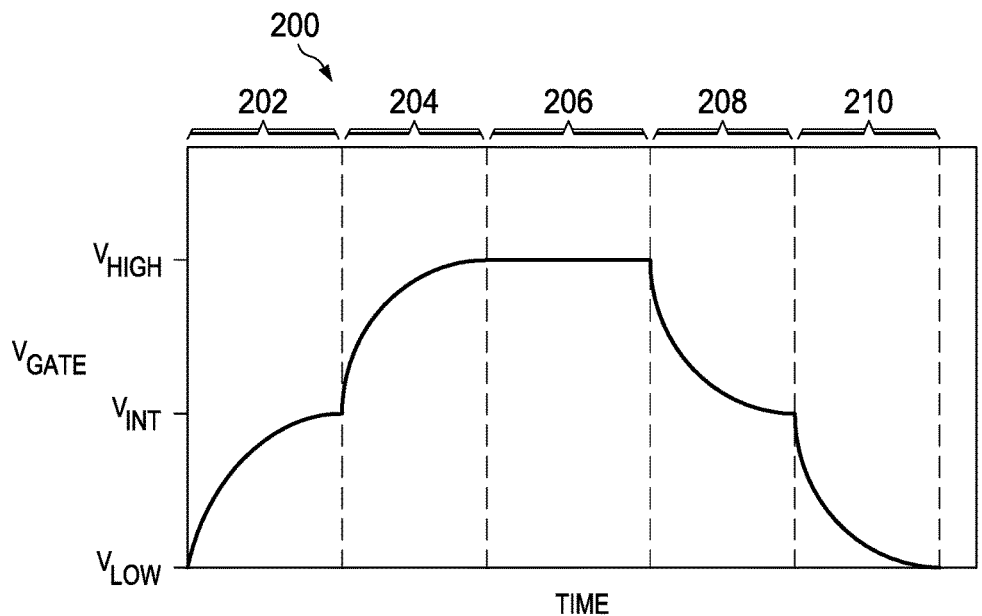
FIG. 2 is a chart 200 depicting potential difference across a gate of a transistor over time when the potential is applied to, and drained from, the gate of the transistor in stages, according to some embodiments of the inventive subject matter.

While FIG. 1 depicts an example circuit for increased efficiency in driving a gate of a transistor, FIG. 2 depicts potential difference across a gate of a transistor in an example circuit, such as that described in FIG. 1.

FIG. 2 is a chart 200 depicting potential difference across a gate of a transistor over time when the potential is applied to, and drained from, the gate of the transistor in stages, according to some embodiments of the inventive subject matter. The potential difference across the gate of the transistor (i.e., voltage across the gate of the transistor) is denoted as "$V_{gate}$" and is depicted on the Y-axis of the chart. Time is depicted on the X-axis of the chart. As described in the discussion of FIG. 1, the gate of the transistor is coupled to three voltage devices: a first voltage device having a potential difference of $V_{high}$, a second voltage device having a potential difference of $V_{low}$, and a third voltage device having a potential difference of $V_{int}$. At a time before t=0, $V_{gate} \leq V_{low}$ and the first switch, second switch, and third switch are open.

At t=0, the third switch is closed and the potential difference of $V_{int}$ is applied to the gate of the transistor. During the first time period 202, the potential difference across the gate of the transistor and the potential difference of the third voltage device move toward an equilibrium such that $V_{gate}=V_{int}$ at the end of the first time period 202. At the end of the first time period 202, the third switch is opened.

At the beginning of the second time period 204, the first switch is closed. When the first switch is closed, the potential difference of $V_{high}$ is applied to the gate of the transistor. During the second time period, 204, the potential difference across the gate of the transistor and the potential difference of the first voltage device move toward an equilibrium such that $V_{gate}=V_{high}$ at the end of the second time period 204. At the end of the second time period 204 (i.e., when $V_{gate}=V_{high}$), the potential difference across the gate of the transistor is sufficient to allow current to flow through the source and drain of the transistor (i.e., the transistor is "on"). It should be noted that in some embodiments, $V_{high}$ may be large enough (and the source/drain voltage low enough) that $V_{high}$ is greater than the minimum voltage necessary to achieve the threshold voltage for the transistor. In such embodiments, $V_{gate}$ may never reach $V_{high}$. Nevertheless, assuming that $V_{high}$ is sufficient to allow current to flow through the drain and source of the transistor, while $V_{gate}$ may not be equal to $V_{high}$ at the end of the end of the second time period 204, $V_{gate}$ will at least be great enough that the threshold voltage is achieved. Whether equilibrium is reached, the potential difference across the gate of the transistor remains sufficient to allow current to flow through the source and drain of the transistor so long as the first switch is closed (assuming that the first voltage device can continuously provide the requisite potential difference). This state lasts for the duration of the third time period 206. At the end of the third time period 206, the first switch is opened.

After the first switch is opened, the potential difference across the gate of the transistor may be nonzero. According to some embodiments of the inventive subject matter, just as the potential difference across the gate of the transistor is applied in steps, the potential difference across the gate of the transistor can be drained in steps. For example, after the first switch is opened, the third switch can be closed. As depicted in FIG. 2, the third switch is closed at the beginning of the fourth time period 208. During the fourth time period 208, charge is drained from the gate of the transistor to the third voltage device. Put simply, during the fourth time period 208 the potential difference across the gate of the transistor and the potential difference of the third voltage device move toward an equilibrium such that $V_{gate}=V_{int}$ at the end of the fourth time period 208. At the end of the fourth time period 208, the third switch is opened.

At the beginning of the fifth time period 210, the second switch is closed. During the fifth time period, charge is drained from the gate of the transistor to the second voltage device. In some embodiments, the second voltage device is a ground. In such embodiments, all (or a majority of) the remaining charge is drained to the second voltage device and the potential difference across the gate of the transistor reaches zero at the end of the fifth time period 210.

Example Circuit

Figure 3:
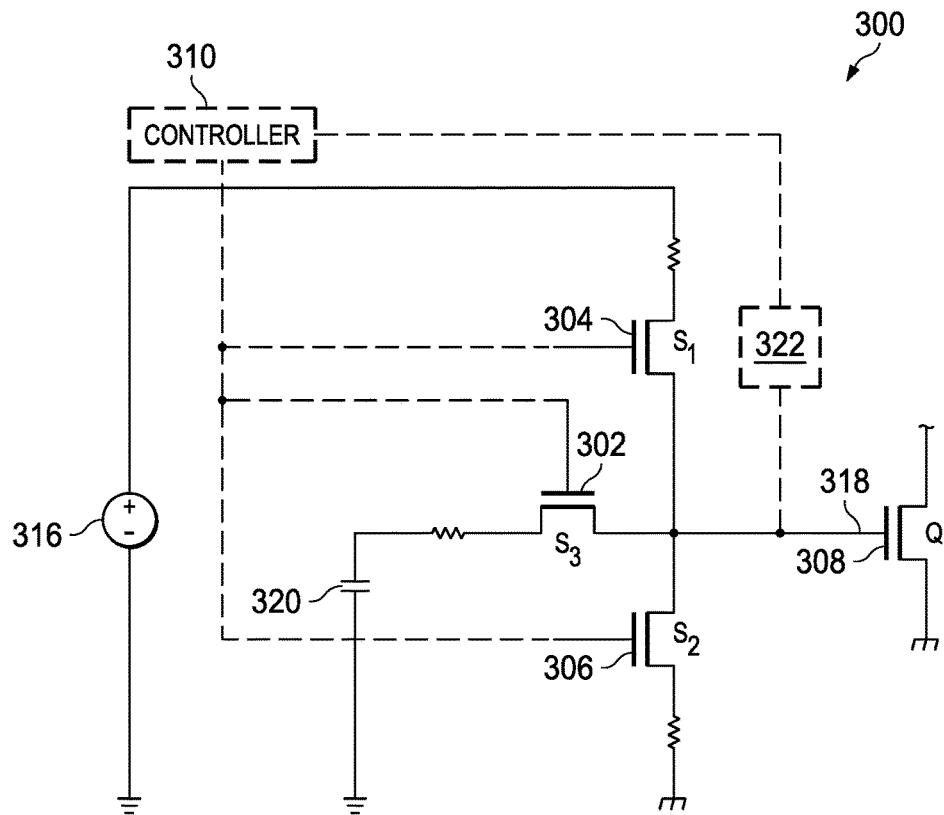
FIG. 3 depicts an example circuit 300 including a first transistor 304, a second transistor 306, and a third transistor 302 coupled to a gate 318 of a driven transistor 308 in which potential can be applied to, and/or drained from, the gate 318 of the driven transistor 308 in steps and that allows for reclamation of potential from the gate 318 of the driven transistor 308, according to some embodiments of the inventive subject matter.

While FIGS. 1 and 2 provide introductory information about a generic circuit having multiple switches and voltage devices used to drive the gate of a transistor, FIG. 3 and the accompanying text describe a more specific exemplary circuit in which a number of transistors are used as switches to control application of potential differences from multiple voltage devices to drive the gate of a transistor.

FIG. 3 depicts an example circuit 300 including a first transistor 304, a second transistor 306, and a third transistor 302 coupled to a gate 318 of a driven transistor 308 in which potential can be applied to, and/or drained from, the gate 318 of the driven transistor 308 in steps and that allows for reclamation of potential from the gate 318 of the driven transistor 308, according to some embodiments of the inventive subject matter. A source of the first transistor 304 is coupled to a first voltage device 316, the drain of the first transistor 304 is coupled to a gate 318 of the switch transistor 308, and a gate of the first transistor is coupled to a controller 310. A source of the second transistor 306 is coupled the gate 318 of the driven transistor 308, a drain of the second transistor 306 is coupled to a second voltage device (in this example, ground), and a gate of the second transistor 306 is coupled to the controller 310. A source of the third transistor 302 is coupled to a third voltage device 320 (e.g., a capacitor, as depicted in FIG. 3), a drain of the third transistor 302 is coupled to the gate 318 of the driven transistor, and a gate of the third transistor 302 is coupled to the controller 310. The third voltage device 320 is used to both apply charge to, and drain charge from, the gate 318 of the driven transistor 308. Consequently, charge remaining on the gate 318 of the driven transistor 308 that would otherwise be drained to ground is reclaimed by the third voltage device 320 and applied to the gate 318 of the driven transistor 308 in subsequent cycles to aid in driving the gate 308 of the driven transistor 308.

When applying a potential difference to the gate 318 of the driven transistor 308, the controller 310 applies a potential difference to the gate of the third transistor 302 so as to allow current from the third voltage device 320 to flow through the source and drain of the third transistor 302 and to the gate 318 of the driven transistor 308. Put simply, the controller 310 turns the third transistor 302 on. After the third voltage device 320 has applied its potential difference to the gate 318 of the driven transistor 308, the controller 310 turns the third transistor 302 off. In one embodiment, the controller 310 can monitor the potential of the third voltage device 320 and turn the third transistor 302 off when the third voltage device 320 has been discharged. Additionally or alternatively, the controller 310 can monitor the potential difference across the gate 318 of the driven transistor 308. For example, a sensor 322 can be electrically coupled to the gate 318 of the driven transistor 308 and in communication with the controller 310. In such embodiments, the controller 310 can monitor the sensor 322 to determine when the third transistor 302 should be turned off. For example, the controller 310 can turn the third transistor 302 off when the potential difference across the gate 318 of the driven transistor 318 has stabilized. In the embodiment depicted in FIG. 3, the potential difference of the third voltage device 320 is insufficient to allow current to flow through the source and drain of the driven transistor 308.

After the third transistor 302 is turned off, the controller 310 applies a potential difference to the gate of the first transistor 304 to turn the first transistor 304 on. When the first transistor 304 is on, the potential difference from the first voltage device 316 is applied to the gate 318 of the driven transistor 308. In the embodiment depicted in FIG. 3, the potential difference of the first voltage device 316 is sufficient to allow current to flow through the source and drain of the driven transistor 308. The controller 310 continues to provide a potential difference to the gate of the first transistor 304 until it is time to turn the driven transistor 308 off. When it is time to turn the driven transistor 308 off, the controller 310 ceases providing a potential difference to the gate of the first transistor 304. That is, the controller 310 turns the first transistor 304 off.

After turning the first transistor 304 off, the controller 310 provides a potential difference to the gate of the third transistor 302. This turns the third transistor 302 on. If the potential difference across the gate 318 of the driven transistor 308 is greater than the potential difference of the third voltage device 320 (i.e., the potential difference across the gate 318 of the driven transistor 308 is greater than the potential difference across plates of the capacitor), charge is drained from the gate 318 of the driven transistor 308 to the third voltage device 320. This charge is reclaimed by the third voltage device 320 and can be used in subsequent drive cycles to at least partially drive the gate 318 of the driven transistor 308. After the third voltage device 320 drains the charge from the gate 318 of the driven transistor 308, the controller 310 turns the third transistor 302 off. The controller 310 can monitor the potential of the third voltage device 320 and/or the potential difference across the gate 318 of the driven transistor 308 while charge is draining from the gate 318 of the driven transistor 308 to the third voltage device 320. For example, the controller 310 can monitor the potential difference across the gate 318 of the driven transistor 308 via the sensor 322. In some embodiments, the controller 310 turns the third transistor 302 off when the potential difference of the third voltage device 320 is in equilibrium with the potential difference across the gate 318 of the driven transistor 308.

After turning off the third transistor 302, the controller 310 applies a potential difference to the gate of the second transistor 306 to turn the second transistor 306 on. When the second transistor 306 is on, some or all of the charge remaining on gate 318 of the driven transistor 308, if any, can be drained to the second voltage device. In the embodiment depicted in FIG. 3, the second voltage device is a ground.

Example Operations

Figure 4:
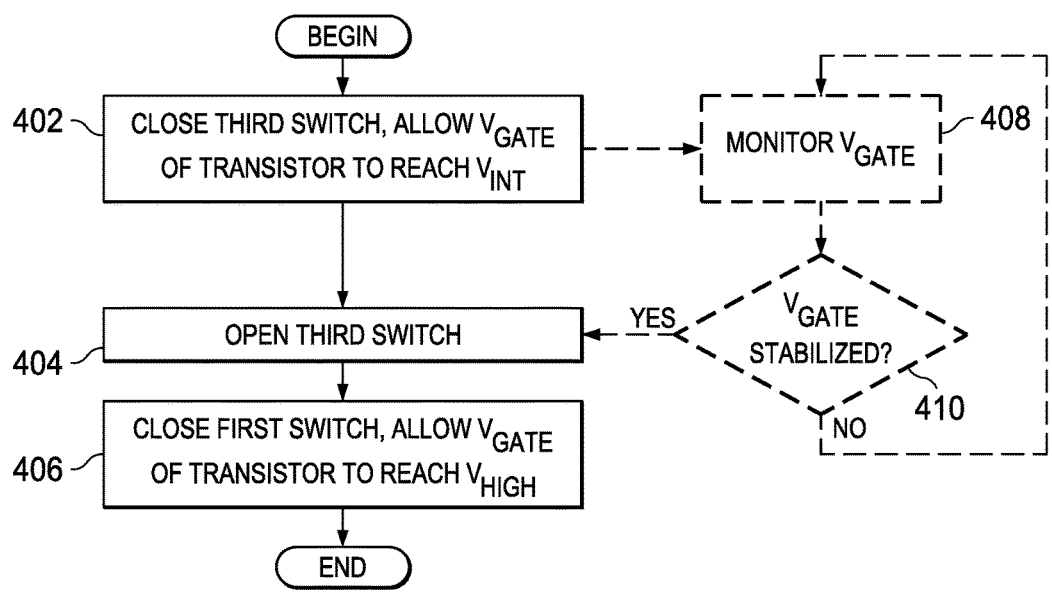
FIG. 4 is a flow chart of example operations for supplying charge to a gate of a transistor, according to some embodiments of the inventive subject matter.
Figure 5:
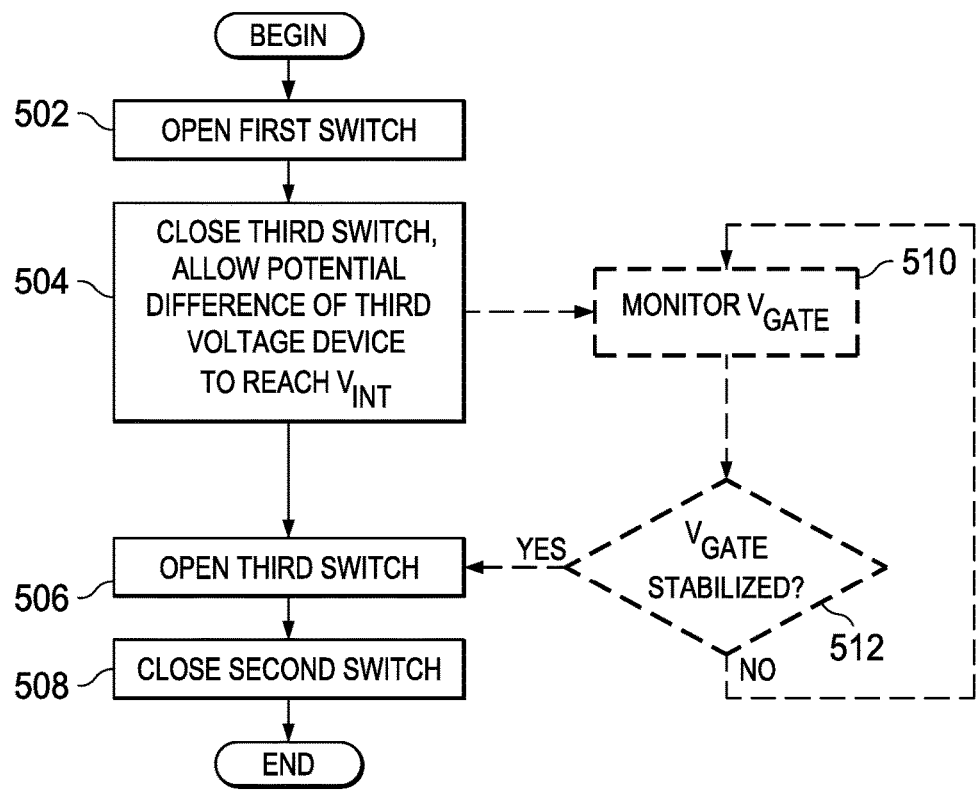
FIG. 5 is a flow chart of example operations for draining charge from a gate of a transistor, according to some embodiments of the inventive subject matter.

While FIG. 3 depicts an example circuit, according to some embodiments of the inventive subject matter, FIGS. 4 and 5 are flow charts of example operations for supplying charge to, and draining charge from, a transistor. Specifically, FIG. 4 is a flow chart of example operations for supplying charge to a transistor in stages and FIG. 5 is a flow chart of example operations for draining charge from a transistor in stages. The flow charts of FIGS. 4 and 5 are based on a circuit similar to those presented in FIGS. 1 and 3. For example, the flow charts of FIGS. 4 and 5 are based on a circuit having a first switch, a second switch, a third switch, and a driven transistor. The first switch is coupled to a first voltage device (having a potential difference $V_{high}$) and a gate of the transistor. The second switch is coupled to a second voltage device (having a potential difference $V_{low}$) and the gate of the transistor. The third switch is coupled to a third voltage device (having a potential difference $V_{int}$) and the gate of the transistor. The potential difference $V_{high}$ is greater than the potential difference $V_{int}$, and the potential difference $V_{int}$ is greater than the potential difference $V_{low}$. The potential difference $V_{high}$ is great enough that, when applied to the gate of the transistor, current is able to flow through the drain and supply of the transistor.

FIG. 4 is a flow chart of example operations for supplying charge to a gate of a transistor, according to some embodiments of the inventive subject matter. At the beginning of the flow of FIG. 4, all three switches are open. The flow begins at block 402.

At block 402, a third switch is closed. The third switch is coupled to the gate of the transistor and the third voltage device. The third voltage device has a potential difference of $V_{int}$. Closing the third switch allows charge to flow from the third voltage device to the gate of the transistor. In some embodiments, charge flows to the gate of the transistor from the third voltage device until the potential difference across the gate of the transistor is in equilibrium with the potential difference of the third voltage device. For example, charge can flow from the third voltage device to the gate of the transistor until the potential difference across the gate of the transistor reaches $V_{int}$. The flow continues at block 404. In some embodiments, (e.g., as depicted in FIG. 3 and described in the associated text), the potential difference across the gate of the transistor can be monitored. For example, a sensor can be used to monitor the potential difference across the gate of the transistor. In such embodiments, the flow proceeds from block 402 to block 408 (before proceeding to block 404). At block 408, the potential difference across the gate of the transistor is monitored. The flow continues at decision diamond 410. At decision diamond 410, if the potential difference across the gate of the transistor has not stabilized, the flow continues at block 408 where the potential difference across the gate of the transistor is monitored. If the potential difference across the gate of the transistor has stabilized, the flow continues at block 404.

At block 404, the third switch is opened. When the third switch is opened, charge ceases to flow between the third voltage device and the gate of the transistor. Assuming no loses, the potential difference across the gate of the transistor remains $V_{int}$ after the third switch is opened. Because the potential difference $V_{int}$ is not sufficient to allow current to flow through the source and drain of the transistor, the transistor remains off. The flow continues at block 406.

At block 406, the first switch is closed. The first switch is coupled to the gate of the transistor and the first voltage source. The first voltage source has a potential difference of $V_{high}$. Closing the first switch allows charge to flow from the first voltage device to the gate of the transistor. Once the potential difference across the gate of the transistor is sufficient to allow current to flow through the source and drain of the transistor, the transistor turns on. In some embodiments, the potential difference across the gate of the transistor may reach $V_{high}$, although this is not required.

In some embodiments, after block 406, the flow ends. However, in other embodiments, a cyclical on and off routine for the transistor may be desired. In such embodiments, the example operations of FIG. 4 can be followed by the example operations presented in FIG. 5, which turn the transistor off.

FIG. 5 is a flow chart of example operations for draining charge from a gate of a transistor, according to some embodiments of the inventive subject matter. The flow begins at block 502.

At block 502, the first switch is opened. As previously discussed, the first switch is coupled to a first voltage device and the gate of the transistor such that when the first switch is closed, charge can flow from the first voltage device to the gate of the transistor. The flow continues at block 504.

At block 504, the third switch is closed. Although the first switch is opened at block 502, the potential difference across the gate of the transistor is nonzero. When the third switch is closed, charge can flow between the gate of the transistor and the third voltage device. If the potential difference across the gate of the transistor is greater than the potential difference of the third voltage device, charge can flow from the gate of the transistor to the third voltage device. The charge on the gate of the transistor is being reclaimed by the third voltage device. This charge can be used in subsequent drive cycles to at least partially drive the gate of the transistor. The flow continues at block 506. In some embodiments, (e.g., as depicted in FIG. 3 and described in the associated text), the potential difference across the gate of the transistor can be monitored. For example, a sensor can be used to monitor the potential difference across the gate of the transistor. In such embodiments, the flow proceeds from block 504 to block 510 (before proceeding to block 506). At block 510, the potential difference across the gate of the transistor is monitored. The flow continues at decision diamond 512. At decision diamond 512, if the potential difference across the gate of the transistor has not stabilized, the flow continues at block 510 where the potential difference across the gate of the transistor is monitored. If the potential difference across the gate of the transistor has stabilized, the flow continues at block 506.

At block 506, the third switch is opened. When the third switch is open, current cannot flow between the third voltage device and the gate of the transistor. The flow continues at block 508.

At block 508, the second switch is closed. When the second switch is closed, the second voltage device is coupled to the gate of the transistor. Accordingly, any charge remaining on the gate of the transistor can drain to the second voltage device. In some embodiments, the potential difference of the third voltage device is regulated by the circuit. For example, if the third voltage device currently has a voltage of zero, during the off cycle (i.e., during the example operations depicted in FIG. 5) when the third switch is closed, charge can flow from the gate of the transistor up to the capacity of the third voltage device (i.e., $V_{int}$). At the other extreme, if the potential difference of the third voltage device is equal to, or above, $V_{int}$, any excess charge that cannot drain from the gate of the transistor to the third voltage device is drained to the second voltage device. For example, in some embodiments, any excess charge can drain to ground via the second switch. After block 508, the flow ends. However, in embodiments described above in which the transistor is cycled between on and off states, the flow can continue with the example operations of FIG. 4.

General

Although the figures and description describe three switches/transistors and three voltage devices coupled to the gate of a driven transistor, embodiments are not so limited. For example, the third switch/transistor and third voltage device can be replaced by two or more switches/transistors and voltage devices. In such embodiments, each of the two or more switches/transistors and voltage devices would be coupled to the gate of the driven transistor. Each of the two or more voltage devices would have a capacity that is insufficient to allow current to flow through the source and drain of the driven transistor. Consequently, each of the two or more voltage devices would be able to partially drive the gate of the driven transistor. Likewise, each of the two or more voltage devices would be able to reclaim/drain charge from the gate of the driven transistor.

Although FIG. 3 depicts a single controller coupled to the gates of the first, second, and third transistors, embodiments are not so limited. In some embodiments, each of the first, second, and third transistors may have separate and/or independent controllers, or two of the transistors may have a common controller. Additionally, in some embodiments, the controller may be able to monitor the potential difference of one or more of the first, second, or third voltage device and/or the gate of the driven transistor. In such embodiments, the controller can make determinations as to when each transistor/switch should be on/closed or off/open based on a potential difference reading from one or more of the first, second, or third voltage devices and/or the gate of the driven transistor. Additionally, in some embodiments, the controller may base such a determination on time.

In some embodiments, the driven transistor is transistor that is designed to operate under significant power levels. For example, the transistor can be a power MOSFET. Because of the high power levels under which the driven transistor operates, efficiency gains realized from recovering charge from the gate of the driven transistor can be significant.

What is claimed is:

1. An apparatus comprising:
   a transistor;
   a first switch coupled between a first voltage device and the transistor to selectively electrically connect the first voltage device to the transistor, wherein the first voltage device provides a first charge sufficient to allow current to flow through the transistor in response to closing the first switch;
   a second switch coupled between a second voltage device and the transistor to selectively electrically connect the second voltage device to the transistor, wherein the second voltage device removes charge from the transistor to stop flow of current through the transistor in response to closing the second switch; and
   a third switch coupled between a third voltage device and the transistor to selectively electrically connect the third voltage device to the transistor, wherein the third voltage device provides a second charge to the transistor that is less than the first charge in response to closing the third switch.

2. The apparatus of claim 1, wherein the first switch, the second switch, and the third switch are electrically coupled to a gate of the transistor.

3. The apparatus of claim 1, wherein a potential difference of the first voltage device is greater than a potential difference of the third voltage device and the potential difference of the third voltage device is greater than a potential difference of the second voltage device.

4. The apparatus of claim 1, wherein the second charge is insufficient to allow current to flow through the transistor.

5. The apparatus of claim 1, wherein one or more of the first switch, the second switch, and the third switch are transistors.

6. The apparatus of claim 1, further comprising a controller operatively coupled to the first switch, the second switch, and the third switch, wherein the controller is configured to:
   close the third switch while the second switch and the first switch are open to apply the second charge to the transistor via the third voltage device;
   after the second charge applied to the transistor via the third voltage device stabilizes, open the third switch; and
   after opening the third switch, close the first switch while the third switch and the second switch are open to apply the first charge to the transistor via the first voltage device.

7. The apparatus of claim 1, wherein the third voltage device reclaims a charge on a gate of the transistor when a potential difference across a gate of the transistor is greater than a potential difference of the third voltage device.

8. A method of controlling application and removal of charge from a gate of a transistor, the method comprising:
   closing a pre-charge switch, wherein a pre-charge voltage device provides a first charge to a transistor in response to closing the pre-charge switch;
   opening the pre-charge switch; and
   closing an on switch, wherein an on voltage device provides a second charge to the transistor in response to closing the on switch, the charge from the on voltage device sufficient to allow current to flow through the transistor and higher than the charge from the pre-charge voltage device;

opening the on switch; and closing an off switch, wherein closing the off switch removes a remaining charge from the transistor to stop the current from flowing through the transistor.

9. The method of claim 8, wherein the off switch is coupled to a ground.

10. The method of claim 8, further comprising:

opening the on switch; and closing the pre-charge switch, wherein the pre-charge voltage device reclaims a portion of the remaining charge from the transistor in response to closing the pre-charge switch.

* * * * *